United States Patent
Ishizone et al.

(10) Patent No.: US 7,616,410 B2
(45) Date of Patent: Nov. 10, 2009

(54) MAGNETIC DETECTING ELEMENT HAVING FREE LAYER FORMED OF NIFE ALLOY AND METHOD OF MANUFACTURING THE SAME

(75) Inventors: Masahiko Ishizone, Niigata-ken (JP); Yosuke Ide, Niigata-ken (JP); Masamichi Saito, Niigata-ken (JP); Naoya Hasegawa, Niigata-ken (JP)

(73) Assignee: TDK Corporation, Tokyo (JP)

( * ) Notice: Subject to any disclaimer, the term of this patent is extended or adjusted under 35 U.S.C. 154(b) by 515 days.

(21) Appl. No.: 11/358,825

(22) Filed: Feb. 21, 2006

(65) Prior Publication Data
US 2006/0198060 A1    Sep. 7, 2006

(30) Foreign Application Priority Data
Mar. 2, 2005    (JP)    ............... 2005-057813

(51) Int. Cl.
*G11B 5/39* (2006.01)
(52) U.S. Cl. ............... 360/324.12; 29/603.14
(58) Field of Classification Search ............. 360/324.12
See application file for complete search history.

(56) References Cited

U.S. PATENT DOCUMENTS

| | | | | |
|---|---|---|---|---|
| 6,831,817 B2 * | 12/2004 | Hasegawa et al. | ...... | 360/324.12 |
| 2001/0003023 A1 * | 6/2001 | Saito et al. | ......... | 428/692 |
| 2003/0168673 A1 | 9/2003 | Yuasa et al. | | |
| 2003/0184925 A1 | 10/2003 | Hasegawa et al. | | |
| 2004/0086751 A1 | 5/2004 | Hasegawa et al. | | |
| 2004/0179311 A1 | 9/2004 | Li et al. | | |
| 2004/0228045 A1 | 11/2004 | Hasegawa et al. | | |
| 2005/0099740 A1 * | 5/2005 | Freitag et al. | ........ | 360/324.12 |

FOREIGN PATENT DOCUMENTS

| | | |
|---|---|---|
| JP | 2002-204010 | 7/2002 |
| JP | 2004-031545 | 1/2004 |
| JP | 2004-095584 | 3/2004 |
| JP | 2004-095587 | 3/2004 |
| JP | 2004-282073 | 10/2004 |

OTHER PUBLICATIONS

Search Report dated Jun. 7, 2006, for corresponding British Patent Application No. 0602488.9.

* cited by examiner

*Primary Examiner*—Craig A Renner
*Assistant Examiner*—Tamara Ashford
(74) *Attorney, Agent, or Firm*—Brinks Hofer Gilson & Lione

(57) ABSTRACT

There are provided a magnetic detecting element capable of maintaining large ΔRA and of reducing magnetostriction by improving a material forming a free magnetic layer, and a method of manufacturing the same. An NiFeX alloy layer is formed in a free magnetic layer. For example, the element X is Cu. The NiFeX alloy layer formed in the free magnetic layer makes it possible to maintain large ΔRA and to more reduce the magnetostriction of the free magnetic layer, compared with a structure in which an NiFe alloy layer is formed in the free magnetic layer.

14 Claims, 7 Drawing Sheets

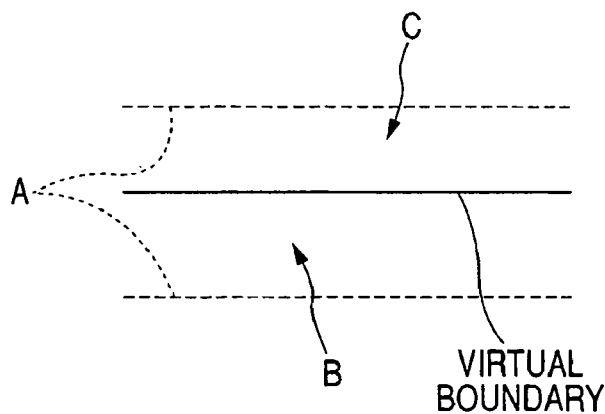
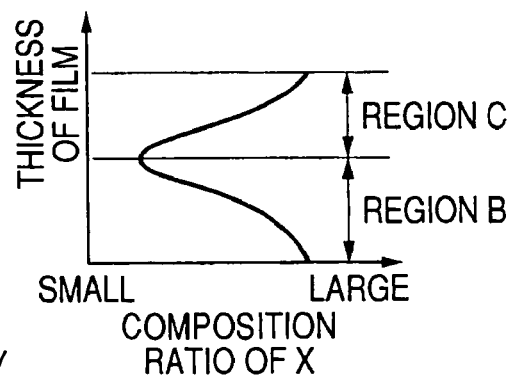
FIG. 4A
FIG. 4B
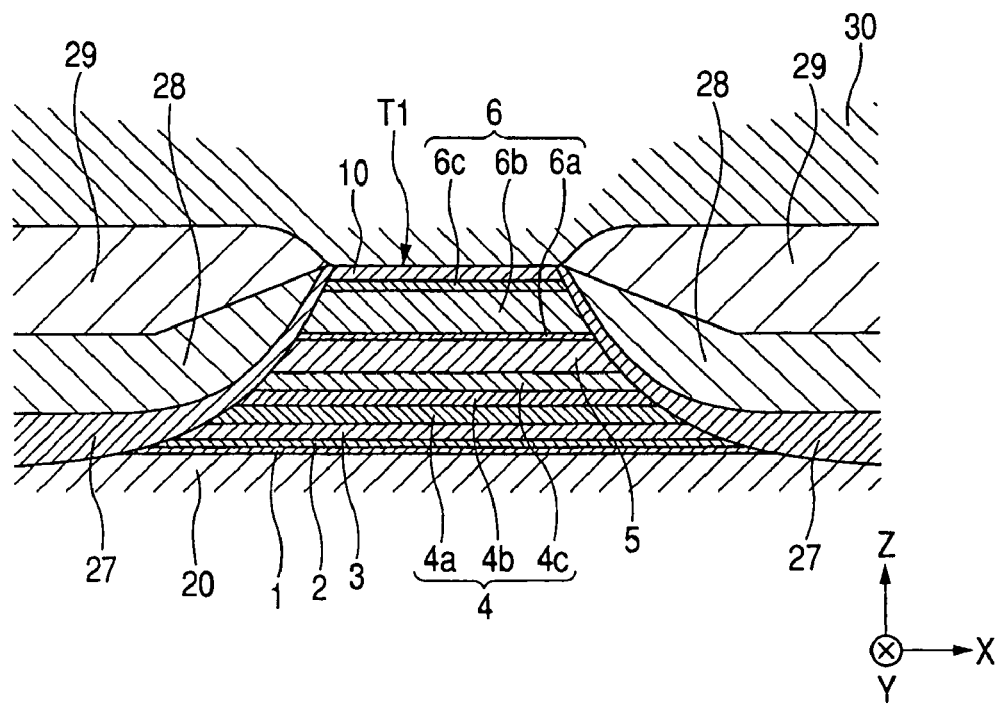
FIG. 5

MAGNETIC DETECTING ELEMENT HAVING FREE LAYER FORMED OF NIFE ALLOY AND METHOD OF MANUFACTURING THE SAME

BACKGROUND OF THE INVENTION

1. Field of the Invention

The present invention relates to a magnetic detecting element including a pinned magnetic layer whose magnetization direction is fixed and a free magnetic layer which is formed on the pinned magnetic layer with a non-magnetic layer interposed therebetween and whose magnetization direction varies in accordance with an external magnetic field. In particular, the invention relates to a magnetic detecting element capable of maintaining large $\Delta RA$, which is the product of a magnetoresistance variation $\Delta R$ and an element area A, and of reducing magnetostriction, and a method of manufacturing the same.

2. Description of the Related Art

A magnetic detecting element having a multi-layer film of a free magnetic layer, a non-magnetic layer, and a pinned magnetic layer is classified into a CIP (current in the plane) type or a CPP (current perpendicular to the plane) type, according to a direction in which a current flows through the multi-layer film.

In the CIP-type magnetic detecting element, a current flows in a direction parallel to the surface of each layer of the multi-layer film. In the CPP-type magnetic detecting element, a current flows in a direction perpendicular to the surface of each layer of the multi-layer film.

In general, the CPP-type magnetic detecting element has an advantage in that it has an element size smaller than that of the CIP-type magnetic detecting element to more increase reproduction power. Therefore, the CPP-type magnetic detecting element has a structure capable of achieving high-density recording, and thus it is expected that the CPP-type magnetic detecting element will be used in place of the currently dominating CIP-type magnetic detecting element in the near future.

Further, the free magnetic layer is formed of, for example, a CoFe alloy or an NiFe alloy. For example, JP-A-2004-282073 discloses the free magnetic layer formed of the CoFe alloy.

In addition, JP-A-2004-282073 discloses a method of controlling the magnetostriction of the free magnetic layer. In a structure disclosed in JP-A-2004-282073, the free magnetic layer includes a plurality of ferromagnetic layers formed of a CoFe alloy and copper layers provided among the ferromagnetic layers, and a copper layer subjected to an oxidation exposure process is included in the copper layers, which makes it possible to reduce the magnetostriction of the free magnetic layer.

However, since the CoFe alloy has higher uniaxial anisotropy and stronger coercive force than an NiFe alloy, the CoFe alloy, which is the main ingredient of the free magnetic layer, makes it difficult to invert the magnetization of the free magnetic layer with an external magnetic field, resulting in low sensitivity.

Further, in the structure disclosed in JP-A-2004-282073, the copper layer subjected to the oxidation exposure process is necessarily included in the free magnetic layer. However, since the copper layer is apt to oxidize, the CoFe alloy formed below the copper layer is also apt to oxidize, which causes serious problems in that the free magnetic layer is demagnetized and magnetic characteristics of the free magnetic layer are deteriorated.

It is possible to increase the value of $\Delta RA$, which is the product of a magnetoresistance variation $\Delta R$ and an element area A by forming the free magnetic layer containing an NiFe alloy as the main ingredient and by appropriately adjusting the composition ratio of the NiFe alloy. An increase in the value of $\Delta RA$ is a very important factor to achieve a CPP-type magnetic detecting element having high recording density in the near future.

However, when the composition ratio of Ni in the NiFe alloy is adjusted to increase the value of $\Delta RA$, the magnetostriction becomes large. The large magnetostriction causes problems in which a film is distorted and the free magnetic layer is much affected by stress caused by a difference between a thermal expansion coefficient thereof and thermal expansion coefficient of other layers. Therefore, it is necessary to reduce the magnetostriction of the free magnetic layer while maintaining large $\Delta RA$.

Further, JP-A-2004-95587 discloses a structure in which a free magnetic layer is formed of an NiFe alloy. In the structure disclosed in JP-A-2004-95587, the free magnetic layer has a laminated ferrimagnetic structure of a first free magnetic layer, a non-magnetic intermediate layer, and a second free magnetic layer. The free magnetic layer is formed in a laminated structure of an NiFe film, an Ru film, and an NiFe film. An RKKY interaction occurs between the first free magnetic layer and the second free magnetic layer, which causes the magnetization direction of the first free magnetic layer to be antiparallel to that of the second free magnetic layer (see paragraph [0068] of JP-A-2004-95587).

However, an object of JP-A-2004-95587 is only to increase the value of $\Delta RA$, but JP-A-2004-95587 does not disclose a structure for maintaining large $\Delta RA$ and for reducing magnetostriction when the free magnetic layer is formed of an NiFe alloy.

SUMMARY OF THE INVENTION

The present invention has been finalized with a view to solving the above-mentioned problems, and it is an object of the invention to provide a magnetic detecting element capable of maintaining large $\Delta RA$ and of reducing magnetostriction by improving a material forming a free magnetic layer, and a method of manufacturing the same.

According to an aspect of the invention, a magnetic detecting element includes: a pinned magnetic layer whose magnetization direction is fixed; and a free magnetic layer which is formed on the pinned magnetic layer with a non-magnetic layer interposed therebetween and whose magnetization direction varies in accordance with an external magnetic field. In the magnetic detecting element, at least a portion of the free magnetic layer is formed of an NiFeX alloy layer (an element X is composed of at least one element selected from Cu, Sc, Ti, Zn, Zr, Hf, Au, Ag, Mn, and Al), and an average composition ratio of the element X is in the range of 5 to 20 atomic percent.

As described above, according to the above-mentioned structure, since at least a portion of the free magnetic layer is formed of the NiFeX alloy layer (the element X is composed of at least one element selected from Cu, Sc, Ti, Zn, Zr, Hf, Au, Ag, Mn, and Al), it is possible to more reduce the magnetostriction of the free magnetic layer, compared with a structure in which the free magnetic layer is formed of an NiFe alloy. However, when the composition ratio of the element X rises, the value of $\Delta RA$ greatly decreases. Therefore, the average composition ratio of the element X is set in the range of 5 to 20 atomic percent, in order to keep $\Delta RA$ at a large value and to reduce the magnetostriction.

In the magnetic detecting element according to this aspect, it is preferable that the element X be diffused in the entire range from a lower surface and to an upper surface of the NiFeX alloy layer. Alternatively, preferably, regions where the composition ratio of the element X increases from the lower surface toward the upper surface of the NiFeX alloy layer, and regions where the composition ratio of the element X decreases from the lower surface toward the upper surface of the NiFeX alloy layer are alternately formed.

In this aspect of the invention, it is necessary to form the NiFeX alloy by the diffusion of NiFe and the element X. That is, it is not preferable that the element X exist in the free magnetic layer in the form of a layer. This is because the layer made of the element X causes a decrease in the value of $\Delta RA$. Therefore, preferably, the element X is uniformly diffused into the NiFeX alloy. Alternatively, it is preferable that the element X does not exist in the form of a layer in the free magnetic layer although it is not uniformly diffused, even when the above-mentioned variation in composition occurs.

Further, in the magnetic detecting element according to this aspect, preferably, {[the average composition ratio of Ni/(the average composition ratio of Ni+the average composition ratio of Fe)]×100} is in the range of 60 to 80. According to this structure, it is possible to ensure large $\Delta RA$ and to form a free magnetic layer having weak coercive force.

Furthermore, in the magnetic detecting element according to this aspect, it is preferable that the element X be Cu.

Moreover, in the magnetic detecting element according to this aspect, preferably, the free magnetic layer has a laminated structure in which diffusion preventive layers made of a magnetic material are formed on lower and upper sides of the NiFeX alloy layer, and the diffusion preventive layer comes into contact with an interface with the non-magnetic layer. More specifically, it is preferable that the diffusion preventive layers be formed of a CoFe alloy. According to this structure, it is possible to appropriately prevent the NiFeX alloy layer from being diffused into the non-magnetic layer.

According to another aspect of the invention, a magnetic detecting element includes: an antiferromagnetic layer; a pinned magnetic layer which is formed so as to come into contact with the antiferromagnetic layer and whose magnetization direction is fixed in accordance with an exchange anisotropic magnetic field with the antiferromagnetic layer; and a free magnetic layer which is formed on the pinned magnetic layer with a non-magnetic layer interposed therebetween. In the magnetic detecting element, at least a portion of the free magnetic layer is formed of an NiFeX alloy layer (an element X is composed of at least one element selected from Cu, Sc, Ti, Zn, Zr, Hf, Au, Ag, Mn, and Al), and an average composition ratio of the element X is in the range of 5 to 20 atomic percent.

Furthermore, in the magnetic detecting element according to this aspect, preferably, a plurality of the non-magnetic layers are formed on the lower and upper sides of the free magnetic layer, and a plurality of the pinned magnetic layers are positioned on the upper side of one of the non-magnetic layers and on the lower side of the other non-magnetic layer. In this case, it is preferable that antiferromagnetic layers be positioned on the upper side of the one pinned magnetic layer and on the lower side of the other pinned magnetic layer to fix the magnetization directions of the pinned magnetic layers in predetermined directions by an exchange anisotropic magnetic field.

Moreover, in particular, the above-mentioned aspect of the invention can be effectively applied to a CPP-type magnetic detecting element in which a sensing current flows in a direction perpendicular to surfaces of the pinned magnetic layer, the non-magnetic layer, and the free magnetic layer.

Further, according to still another aspect of the invention, there is provided a method of manufacturing a magnetic detecting element including a pinned magnetic layer whose magnetization direction is fixed; and a free magnetic layer which is formed on the pinned magnetic layer with a non-magnetic layer interposed therebetween and whose magnetization direction varies in accordance with an external magnetic field. The method includes forming the free magnetic layer having at least an NiFeX alloy layer therein (an element X is composed of at least one element selected from Cu, Sc, Ti, Zn, Zr, Hf, Au, Ag, Mn, and Al), and setting an average composition ratio of the element X in the range of 5 to 20 atomic percent. According to this manufacturing method of this aspect, it is possible to easily manufacture a magnetic detecting element capable of keeping $\Delta RA$ at a large value and of reducing the magnetostriction.

Further, in the above-mentioned manufacturing method of this aspect, it is preferable that the NiFeX alloy layer be formed by alternately laminating NiFe alloy layers and X element layers made of the X element. In this case, when a laminated structure of the X element layer and the NiFe alloy layer is set as one unit, and when a thickness ratio of the X element layer in the one unit is defined as follows: [the thickness of the X element layer/(the thickness of the NiFe alloy layer+the thickness of the X element layer)×100], preferably, the thickness ratio of the X element layer is set in the range of 5 to 20. When the thickness ratio of the X element layer rises, the magnetostriction of the free magnetic layer is reduced, but the value of $\Delta RA$ greatly decreases. Therefore, it is preferable to adjust the thickness ratio of the X element layer in the above-mentioned range in order to keep $\Delta RA$ at a large value and to reduce the magnetostriction.

Furthermore, in the manufacturing method of this aspect, it is preferable that the thickness of each X element layer be set in the range of 0 Å to 5 Å. When the X element layer has an excessively large thickness, all the elements X are not appropriately diffused into the NiFe alloy layer, and thus the elements X remain in the form of a layer, causing a large decrease in the value of $\Delta RA$. Thus, it is preferable to set the thickness of the X element layer in the above-mentioned range.

Moreover, in the manufacturing method according to this aspect, it is preferable that the thickness of each NiFe alloy layer be set in the range of 5 Å to 10 Å. When the NiFe alloy layer has an excessively large thickness, it is difficult for the element X to be uniformly diffused into the NiFe alloy layer. Thus, it is preferable to set the thickness of the NiFe alloy layer in the above-mentioned range.

Further, in the manufacturing method according to this aspect, it is preferable that the average composition ratio of Ni in each NiFe alloy layer be set in the range of 60 to 80 atomic percent in order to increase the value of $\Delta RA$ and to weaken the coercive force.

Furthermore, in this aspect, preferably, the manufacturing method further includes performing, after forming the magnetic detecting element, a thermal treatment on the magnetic detecting element. The thermal treatment makes it possible to effectively diffuse the NiFe alloy layer and the X element layer.

According to these aspect of the invention, at least a portion of the free magnetic layer is formed of an NiFeX alloy layer (an element X is composed of at least one element selected from Cu, Sc, Ti, Zn, Zr, Hf, Au, Ag, Mn, and Al), and the average composition ratio of the element X is set in the range of 5 to 20 atomic percent. In this way, it is possible to keep ΔRA at a large value and to reduce the magnetostriction of the free magnetic layer.

BRIEF DESCRIPTION OF THE DRAWINGS

FIG. 4A is a partial enlarged view schematically illustrating an NiFeX layer shown in FIG. 3.

FIG. 4B is a graph illustrating a variation in the composition of an element X in the NiFeX layer.

FIG. 5 is a partial cross-sectional view of a reproducing head having the structure of the magnetic detecting element shown in FIG. 2, as viewed from a surface thereof opposite to a recording medium.

DESCRIPTION OF THE PREFERRED EMBODIMENT

Figure 1:
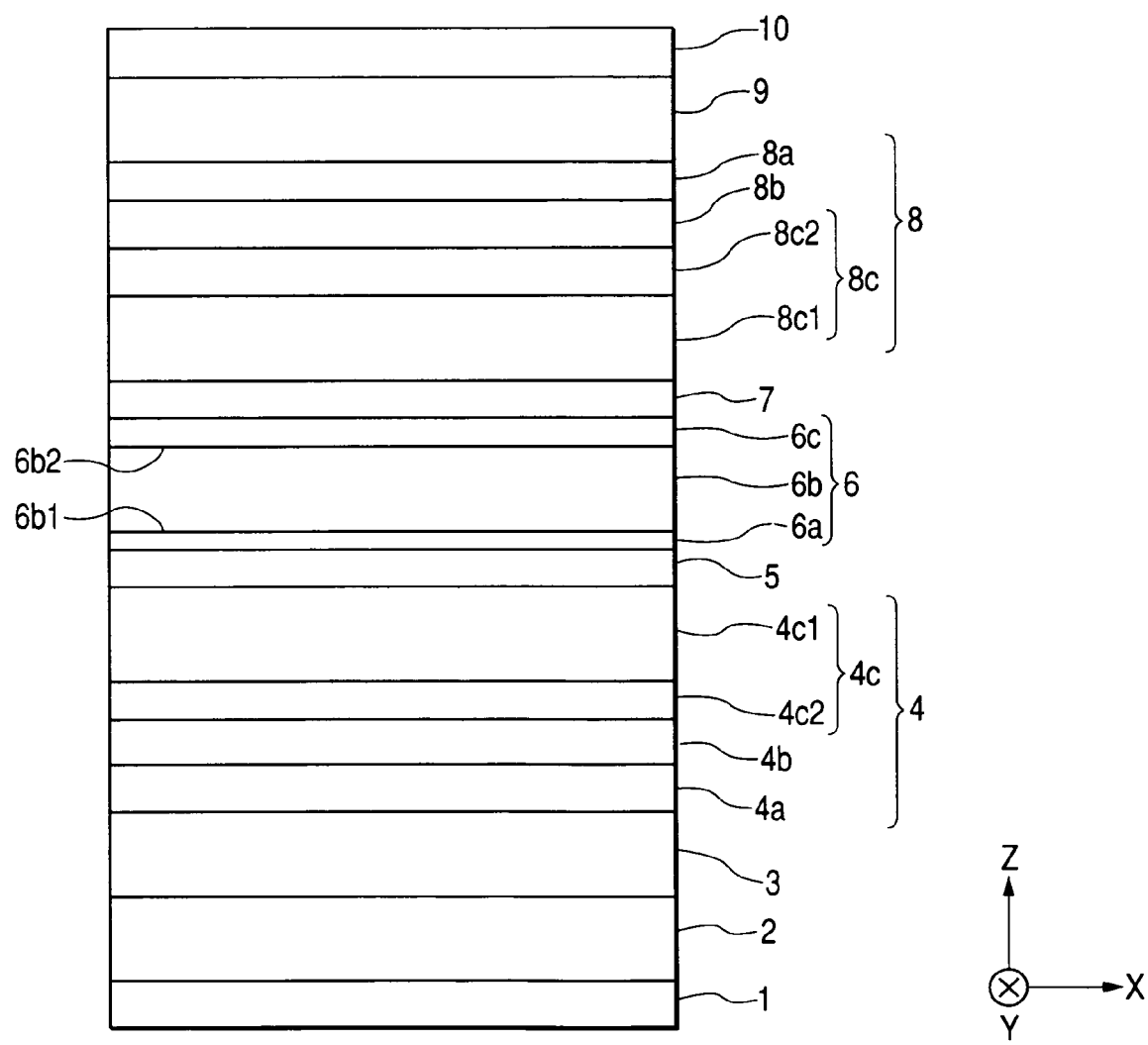
FIG. 1 is a diagram schematically illustrating the structure of a magnetic detecting element (a dual-spin-value thin film element) according to a first embodiment of the invention, as viewed from a surface thereof opposite to a recording medium.

FIG. 1 is a diagram schematically illustrating the laminated structure of a CPP-type dual-spin-value thin film element according to an embodiment of the invention.

The dual-spin-value thin film element is provided at a trailing end portion of a floating slider in a hard disk device and detects a recording magnetic field of, for example, a hard disk. In addition, it is assumed that a magnetic recording medium, such as a hard disk, moves in the Z direction and a leakage magnetic field is applied from the magnetic recording medium in the Y direction.

In FIG. 1, an underlying layer 1 is made of a non-magnetic material composed of one kind or two or more kinds of elements among, for example, Ta, Hf, Nb, Zr, Ti, Mo, and W, and is formed at the lowest layer. A seed layer 2 is provided on the underlying layer 1. The seed layer 2 is made of, for example, NiFeCr or Cr. When the seed layer 2 is made of NiFeCr, the seed layer 2 has a face centered cubic (fcc) structure in which an equivalent crystal surface represented by a {111} plane is preferentially oriented in parallel to a film surface thereof. When the seed layer 2 is made of Cr, the seed layer 2 has a body centered cubic (bcc) structure in which an equivalent crystal surface represented by a {110} plane is preferentially oriented in parallel to the film surface thereof.

Further, the underlying layer 1 has nearly an amorphous structure, but it may not be provided.

An antiferromagnetic layer 3 is preferably made of an antiferromagnetic material containing Mn and an element X (X is at least one element selected from Pt, Pd, Ir, Rh, Ru, and Os).

An X—Mn alloy of these platinum-group elements has good characteristics, such as high corrosion resistance and a high blocking temperature, as an antiferromagnetic material, and is capable of raising an exchange coupling magnetic field (Hex).

In this embodiment of the invention, the antiferromagnetic layer 3 is preferably made of Mn, the element X, and an element X' (X' is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements).

It is preferable that the element X or the element X+X' contained in the antiferromagnetic layer 3 be in the range of about 45 to 60 atomic percent, and more preferably, in the range of about 49 to 56.5 atomic percent. In this case, an interface with a pinned magnetic layer 4 turns to a mismatched state in a stage where a film is formed, and the property of the antiferromagnetic layer 3 may be regularly changed by a thermal treatment.

A lower pinned magnetic layer 4 is formed of a multi-layer structure including a first pinned magnetic layer 4a, a non-magnetic intermediate layer 4b, and a second pinned magnetic layer 4c. The first pinned magnetic layer 4a is magnetized in a direction antiparallel to the magnetization direction of the second pinned magnetic layer 4c by the exchange coupling magnetic field generated at the interface with the antiferromagnetic layer 3 and by an antiferromagnetic exchange coupling magnetic field (Ruderman-Kittel-Kasuya-Yoshida interaction, i.e., RKKY interaction) through the non-magnetic intermediate layer 4b. This antiparallel state is called a laminated ferrimagnetic structure, and this structure can stabilize the magnetization of the lower pinned magnetic layer 4 and increase the exchange coupling magnetic field generated at the interface between the lower pinned magnetic layer 4 and the antiferromagnetic layer 3.

Alternatively, the lower pinned magnetic layer 4 may be formed of only the second pinned magnetic layer 4c, not the laminated ferromagnetic structure.

The first pinned magnetic 4a is formed with a thickness of about 15 Å to 35 Å. The non-magnetic intermediate layer 4b is formed with a thickness of about 8 Å to 10 Å. The second pinned magnetic 4c is formed with a thickness of about 20 Å to 60 Å.

The first pinned magnetic layer 4a is formed of a ferromagnetic material, such as CoFe, NiFe, or CoFeNi. The non-magnetic intermediate layer 4b is formed of a non-magnetic material, such as Ru, Rh, Ir, Cr, Re, or Cu.

The second pinned magnetic layer 4c is formed of a two-layer structure including a non-magnetic-layer-side magnetic layer 4c1 coming into contact with the non-magnetic layer 5 and a non-magnetic-intermediate-layer-side magnetic layer 4c2. In addition, it is preferable that the non-magnetic-layer-side magnetic layer 4c1 be formed of a metallic compound having a Heusler crystal structure in which a composition formula is represented by $X_2YZ$ or XYZ. In this case, the X is at least one element selected from Cu, Co, Ni, Rh, Pt, Au, Pd, Ir, Ru, Ag, Zn, Cd, and Fe; the Y is at least one element selected from Mn, Fe, Ti, V, Zr, Nb, Hf, Ta, Cr, Co, and Ni; and Z is at least one element selected from Al, Sn, In, Sb, Ga, Si, Ge, Pb, and Zn. More specifically, for example, the non-magnetic-layer-side magnetic layer 4c1 is preferably formed of a $Co_2MnGe$ alloy, which makes it possible to improve ΔRA.

Further, the non-magnetic-intermediate-layer-side magnetic layer 4c2 is formed of a ferromagnetic material, such as NiFe or CoFeNi. In particular, it is preferable that both the first pinned magnetic layer 4a and the non-magnetic-intermediate-layer-side magnetic layer 4c2 be formed of a CoFe alloy. This makes it possible to improve the RKKY interaction generated between the non-magnetic-intermediate-layer-side magnetic layer 4c2 and the first pinned magnetic layer 4a and to forcibly fix the magnetization of the first pinned magnetic layer 4a and the second pinned magnetic layer 4c.

The non-magnetic layer 5 formed on the pinned magnetic layer 4 is formed of, for example, Cu, Au, or Ag. The non-magnetic layer 5 formed of Cu, Au, or Ag has a face centered cubic (fcc) structure in which an equivalent crystal surface represented by the {111} plane is preferentially oriented in parallel to a film surface thereof.

A free magnetic layer 6 is formed on the non-magnetic layer 5. A non-magnetic layer 7 is formed on the free magnetic layer 6, and is made of the same material as that used for the non-magnetic layer 5. An upper pinned magnetic layer 8 is formed on the non-magnetic layer 7. The upper pinned magnetic layer 8 has a laminated ferrimagnetic structure in which a second pinned magnetic layer 8c, a non-magnetic intermediate layer 8b, and a first pinned magnetic layer 8a are laminated in this order from the bottom. Materials forming the first pinned magnetic layer 8a, the non-magnetic intermediate layer 8b, and the second pinned magnetic layer 8c are the same as those used for the first pinned magnetic layer 4a, the non-magnetic intermediate layer 4b, and the second pinned magnetic layer 4c, respectively. In addition, similar to the second pinned magnetic layer 4c, the second pinned magnetic layer 8c is formed of a two-layer structure including a non-magnetic-layer-side magnetic layer 8c1 coming into contact with the non-magnetic layer 7 and a non-magnetic-intermediate-layer-side magnetic layer 8c2. Further, the upper pinned magnetic layer 8 may be formed of only the second pinned magnetic layer 8c.

An upper antiferromagnetic layer 9 is formed on the upper pinned magnetic layer 8. The upper antiferromagnetic layer 9 is made of the same material as that used for the lower antiferromagnetic layer 2. A protective layer 10 made of, for example, Ta is formed on the upper antiferromagnetic layer 9.

The magnetization of the free magnetic layer 6 is aligned in a direction parallel to a track width direction (in the X direction of the drawings). Meanwhile, the first pinned magnetic layers 4a and 8a and the second pinned magnetic layers 4c and 8c respectively constituting the pinned magnetic layers 4 and 8 are magnetized in a direction parallel to the height direction (in the Y direction of the drawings). Since the pinned magnetic layers 4 and 8 are formed of the laminated ferrimagnetic structures, the magnetization directions of the first pinned magnetic layers 4a and 8a and the second pinned magnetic layers 4c and 8c are antiparallel to each other.

This embodiment of the invention is characterized in that the free magnetic layer 6 includes an NiFeX ally layer 6b. As the element X, at least one element is selected from Cu, Sc, Ti, Zn, Zr, Hf, Au, Ag, Mn, and Al. It is preferable that the element X be Cu.

Furthermore, the average composition ratio of the element X is in the range of about 5 to 20 atomic percent. Here, the term 'average composition ratio' is a value obtained by calculating the composition ratios of the element X in a number of places by using an SIMS analyzing device and by averaging them. The average composition ratios of Ni and Fe are calculated in addition to the average composition ratio of the element X. Then, the following relationship is satisfied: the average composition ratio of Ni+the average composition ratio of Fe+the average composition ratio of the element X=100 atomic percent.

An NiFeX alloy layer 6b provided in the free magnetic layer 6 makes it possible to effectively reduce magnetostriction in a region where the NiFeX alloy layer 6b is formed, as compared with a structure in which the layer is formed of an NiFe alloy. In this embodiment, when an 'Ni composition ratio' defined by '[the average composition ratio of Ni/(the average composition ratio of Ni+the average composition ratio of Fe)]×100(%)' is set in the same value in both the NiFeX alloy layer 6b and the Nife alloy layer, the magnetostriction may be estimated by respectively measuring the magnetostriction of the free magnetic layer 6 provided with the NiFeX alloy layer 6b and the magnetostriction thereof provided with the NiFe alloy layer and by comparing them.

As the average composition ratio of the element X contained in the NiFeX alloy layer is higher, it is possible to more effectively reduce the magnetostriction. However, in this case, ΔRA is greatly lowered. In the CPP-type magnetic detecting element, ΔRA needs to be raised as high as possible in order to ensure a high output. Therefore, the average composition ratio of Cu is set in the range of 5 to 20 atomic percent in order to make the value of ΔRA equal to that when an NiFe alloy layer is provided in the region 6b of the free magnetic layer 6 or in order to prevent the value of ΔRA from being reduced by 15% or more. In addition, the reduction ratio of ΔRA can be calculated by the following expression: [(ΔRA when the NiFe alloy layer is formed−ΔRA when the NiFeX alloy layer is formed)/ΔRA when the NiFe alloy layer is formed]×100%.

Further, it is preferable that the composition ratio of Ni be set in the range of about 60% to 80%. This range makes it possible to ensure large ΔRA and to reduce coercive force. Alternatively, the composition ratio of Ni may be set in the range of about 10% to 25%. In this case, an increase in coercive force occurs, compared with the case in which the composition ratio of Ni is set in the range of about 60% to 80%, but it is possible to make the value of ΔRA substantially equal to or larger than that when the composition ratio of Ni is set in the range of about 60% to 80%.

As shown in FIG. 1, diffusion preventive layers 6a and 6c are provided on the upper and lower sides of the NiFeX alloy layer 6b. This structure can prevent, particular, Ni contained in the NiFeX alloy layer 6b from being diffused into the non-magnetic layers 5 and 7. It is preferable that the diffusion preventive layers 6a and 6c be made of a CoFe alloy. The diffusion preventive layers 6a and 6c are formed with a thickness considerably smaller than that of the NiFeX alloy layer 6b. For example, the diffusion preventive layers 6a and 6c are formed with a small thickness of about several angstroms. Meanwhile, the NiFeX alloy layer 6b is formed with a large thickness of about 30 Å to 100 Å.

It is preferable that the element X contained in the NiFeX alloy layer 6b be diffused over the entire range from a lower surface 6b1 of the NiFeX alloy layer 6b to an upper surface 6b2 thereof. An analysis of the composition is performed by, for example, an SIMS analyzing device or a nano-beam EDX (energy dispersive X-ray spectroscopy) using a field emission type transmission electron microscope (FE-TEM). In addition, it is preferable that the element X be uniformly diffused from the lower surface 6b1 of the NiFeX alloy layer 6b to the upper surface 6b2 thereof. The term 'uniform diffusion' means that a periodic modulation in composition does not occur from the lower surface 6b1 to the upper surface 6b2 of the NiFeX alloy layer 6b and, when the analyzing device is used to analyze the composition ratio, [(the maximum composition ratio of the element X−the minimum composition ratio of the element X)/the maximum composition ratio of the element X] is smaller than 0.05.

Further, the modulation in composition may occur in the element X in the range from the lower surface 6b1 to the upper surface 6b2 of the NiFeX alloy layer 6b.

Figure 3:
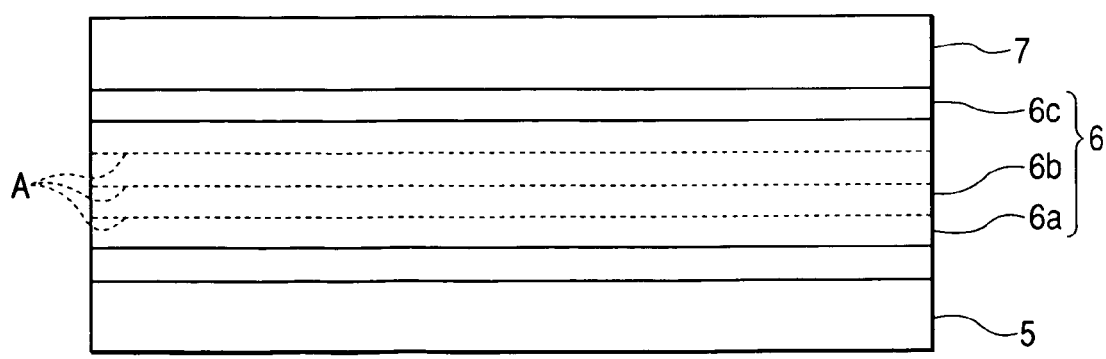
FIG. 3 is a partial enlarged view schematically illustrating a layer structure from a non-magnetic-layer-side magnetic layer of a lower pinned magnetic layer to a non-magnetic-layer-side magnetic layer of an upper pinned magnetic layer shown in FIG. 1.

FIG. 3 is a partial enlarged view schematically illustrating a laminated structure including the non-magnetic layer 5 to the non-magnetic layer 7 shown in FIG. 1.

Regions A represented by broken lines in FIG. 3 indicate places where the element X has a high composition ratio in the NiFeX alloy layer constituting the free magnetic layer 6. In a manufacturing method, which will be described later, the NiFeX alloy layer 6b is formed of a laminated structure including, for example, an NiFe alloy layer and a layer composed of the element X (an X element layer). It is considered that the NiFe alloy and the element X are diffused by, for example, a thermal treatment. In the initial state, the layers made of only the element X are formed in the regions A represented by the broken lines, but the NiFe alloy is diffused into the regions made of only the element X by the thermal treatment. As a result, the layers made of only the element X does not exist, and a laminated region of the NiFe alloy layer and the X element layer is an NiFeX alloy layer. However, the composition ratio of the element X in the regions A represented by the broken lines is higher than that of the element X in the other regions. As shown in FIG. 4 (which is an enlarged view schematically illustrating a portion of the NiFeX alloy layer 6b of the free magnetic layer 6 shown in FIG. 3), considering the composition ratio of the element X in regions B and C between two regions A represented by broken lines, the composition ratio of the element X has a peak value in a portion of the region B adjacent to the region A represented by the broken line, and is gradually lowered in the direction of the region C (the upper direction of FIG. 4). Then, the composition ratio of the element X has the minimum value at a virtual boundary with the region C (the boundary does not exist actually). Meanwhile, in the region C, the composition ratio of the element X is gradually raised from the virtual boundary to the upper part, and has a peak value in the vicinity of the region A represented by the broken line. As such, the composition ratio of the element X is gradually lowered to the upper part in the region B. Meanwhile, the composition ratio of the element X is gradually raised to the upper part in the region C. In addition, the regions B and C alternately appear in the thickness directions thereof. Further, it is preferable that the element X does not have a composition ratio of 0 atomic percent in the vicinity of the virtual boundary where the composition ratio has the minimum value and that the element X be diffused in the entire range from the lower surface 6b1 to the upper surface 6b2 of the NiFeX alloy layer 6b.

As described above, the element X is uniformly diffused in the NiFeX alloy layer 6b or the composition of the element X is modulated therein. In particular, a layer composed of only the element X does not exist in the NiFeX alloy layer 6b (the layer is not formed therein). This structure makes it possible to prevent the lowering of the value of ΔRA.

Figure 2:
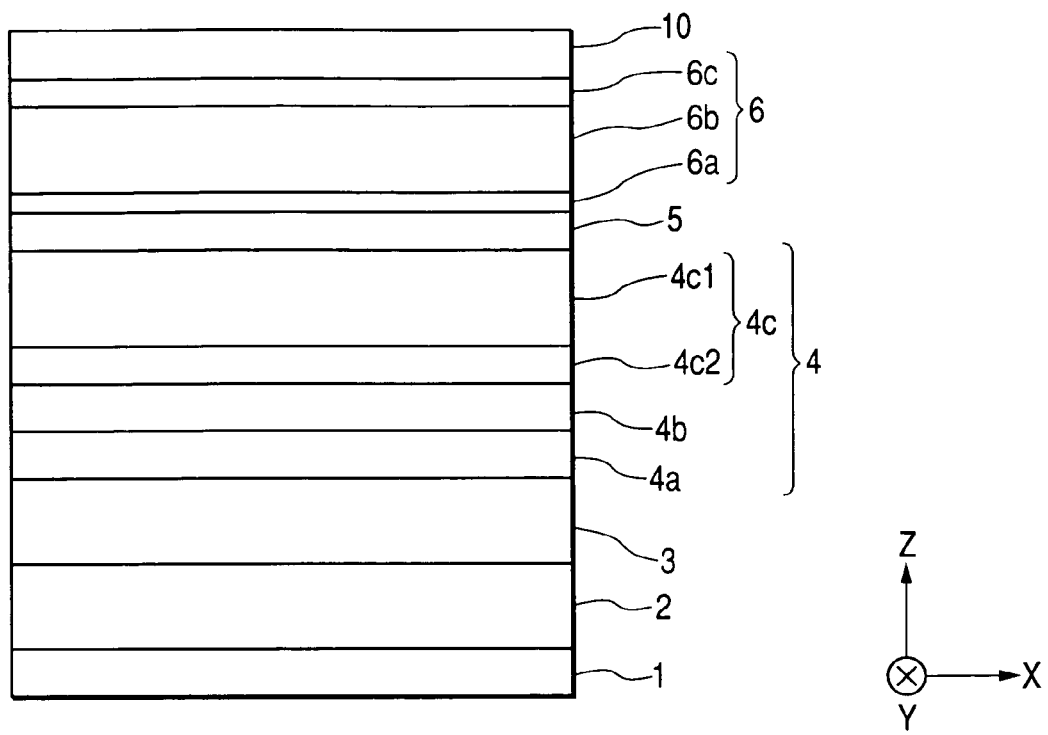
FIG. 2 is a diagram schematically illustrating the structure of a magnetic detecting element (a single-spin-value thin film element) according to a second embodiment of the invention, as viewed from a surface thereof opposite to a recording medium.

FIG. 2 is a diagram schematically illustrating the film structure of a CPP-type single-spin-valve thin film element. In FIG. 2, the same layers as those in FIG. 1 have the same reference numerals.

In the film structure of the CPP-type single-spin-valve thin film element shown in FIG. 2, an underlying layer 1, a seed layer 2, an antiferromagnetic layer 3, a pinned magnetic layer 4, a non-magnetic layer 5, a free magnetic layer 6, and a protective layer 10 are laminated in this order from the bottom. Also, in the film structure of the CPP-type single-spin-valve thin film element shown in FIG. 2, the free magnetic layer 6 is provided with an NiFeX alloy layer 6b in which the average composition ratio of the element X is in the range of about 5 to 20 atomic percent, which makes it possible to maintain large ΔRA and to effectively reduce magnetostriction in a region where the NiFeX alloy layer 6b is formed, compared with a structure in which the layer is formed of an NiFe alloy. In addition, the CPP-type single-spin-valve thin film element may be formed by sequentially laminating the free magnetic layer 6, the non-magnetic layer 5, the pinned magnetic layer 4, and the antiferromagnetic layer 3 from the bottom.

FIG. 5 is a partial cross-sectional view of a reproducing head having the structure of the CPP-type single-spin-valve thin film element shown in FIG. 2, as viewed from a surface thereof opposite to a recording medium.

Reference numeral 20 denotes a lower shield layer 20 made of a magnetic material, and a multi-layer film T1 having the same structure as that of the film shown in FIG. 2 is formed on the lower shield layer 20.

The multi-layer film T1 is formed by laminating an underlying layer 1, a seed layer 2, an antiferromagnetic layer 3, a pinned magnetic layer 4, a non-magnetic material layer 5, a free magnetic layer 6, and a protective layer 10 in this order. In the embodiment shown in FIG. 1, an insulating film 27, a hard bias layer 28, and an insulating layer 29 are formed in this order at both sides of the multi-layer film T1. A longitudinal bias magnetic field from the hard bias layer 28 magnetizes the free magnetic layer 6 in the direction of a track width (in the X direction of FIG. 5).

A bias underlying layer (not shown) may be provided between the insulating layer 27 and the hard bias layer 28. The bias underlying layer is formed of, for example, Cr, W, a W—Ti alloy, or a Fe—Cr alloy.

The insulating layers 27 and 29 are formed of an insulting material, such as $Al_2O_3$ or $SiO_2$, and isolate the upper and lower surfaces of the hard bias layer 28 so as to prevent a current flowing in a direction perpendicular to the interfaces of the layers in the multi-layer film T1 from being divided into both sides of the hard bias layer 28 in the direction of the track width.

The hard bias layer 28 is formed of, for example, a Co—Pt alloy or a Co—Cr—Pt alloy.

An upper shield layer 30 made of a magnetic material is formed on the insulating layers 29 and the protective layer 10. In the CPP-type single-spin-valve thin film element, the lower shield layer 20 and the upper shield layer 30 serve as electrodes, that is, current sources that supply a current so as to flows in the direction perpendicular to the interfaces of the layers in the multi-layer film T1.

The free magnetic layer 6 is magnetized in the direction of the track width (in the X direction of FIG. 5) by the longitudinal bias magnetic field generated by the hard bias layer 28. Therefore, the magnetization of the free magnetic layer 6 is changed with respect to a signal magnetic field (external magnetic field) from a recording medium with high sensitivity. Meanwhile, the magnetization of the pinned magnetic layer 4 is fixed in a direction parallel to the height direction (the Y direction of FIG. 5)

The electrical resistance depends on the relationship between a variation in the magnetization direction of the free magnetic layer 6 and the fixed magnetization direction of the pinned magnetic layer 4 (particularly, the fixed magnetization direction of the second magnetic layer 4c). A leak magnetic field from the recording medium is detected by a change in voltage or current due to the variation in electrical resistance. The free magnetic layer 6 includes the NiFeX alloy layer 6b and diffusion preventive layers 6a and 6c provided at both upper and lower sides of the NiFeX alloy layer 6b.

Figure 6:
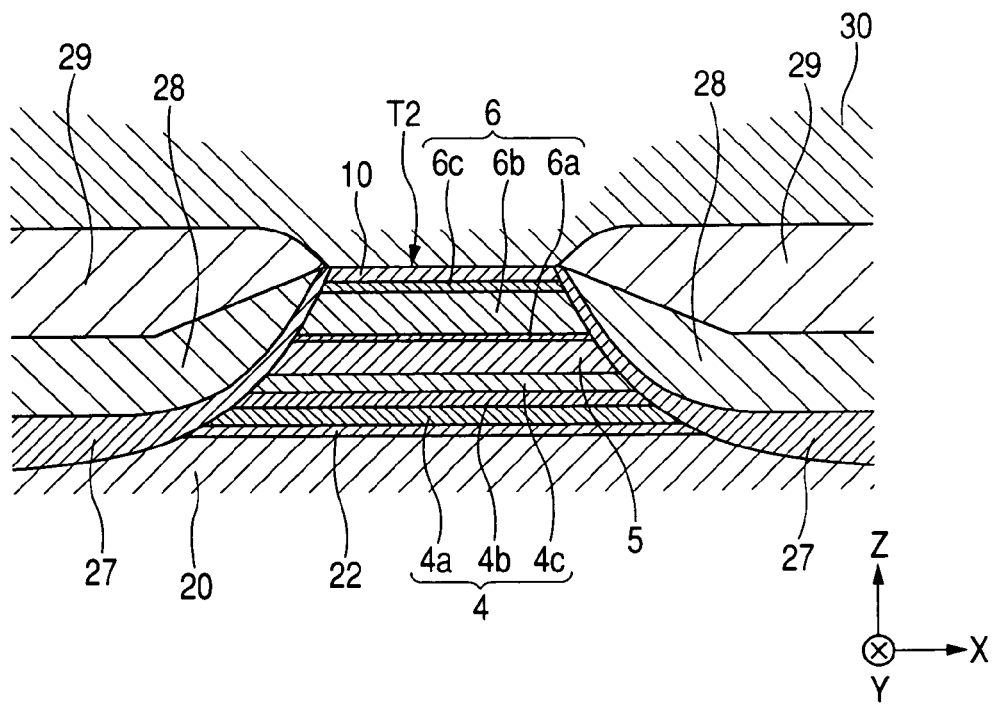
FIG. 6 is a partial cross-sectional view of a reproducing head including a magnetic detecting element having a different structure from that shown in FIG. 5, as viewed from a surface thereof opposite to a recording medium.

FIG. 6 is a partial cross-sectional view of a reproducing head including a CPP-type single-spin-valve thin film element having a different structure from that shown in FIG. 5, as viewed from a surface thereof opposite to a recording medium.

In FIG. 6, the antiferromagnetic layer 2 is not provided, similar to the structure shown in FIG. 5. FIG. 6 shows a so-called self-pinned magnetic detecting element in which the magnetization of a pinned magnetic layer 4 is fixed by the uniaxial anisotropy of the pinned magnetic layer.

In FIG. 6, a magnetostriction enhancing layer 22 is formed with a thickness of about 5 Å to 20 Å on the lower side of the pinned magnetic layer 4. The magnetostriction enhancing layer 22 is formed of, for example, a single element, such as Pt, Au, Pd, Ag, Ir, Rh, Ru, Re, Mo, or W; an alloy of two or more elements selected from the above-mentioned elements; or an R—Mn alloy (here, the element R is composed of at least one element selected from Pt, Pd, Ir, Rh, Ru, Os, Ni, and Fe).

A magnetostriction coefficient λs of the pinned magnetic layer 4 is set to be large to increase magnetoelastic energy, so that the uniaxial anisotropy of the pinned magnetic layer 4 becomes large. The large uniaxial anisotropy of the pinned magnetic layer 3 causes the magnetization of the pinned magnetic layer 4 to be more firmly fixed in a specific direction, which makes it possible to raise the output of a magnetic detecting element and to improve the stability and symmetry of the output.

In the magnetic detecting element shown in FIG. 6, the magnetostriction enhancing layer 22 made of a non-magnetic metallic material is provided on a surface of the first pinned magnetic layer 4a of the pinned magnetic layer 4 which is opposite to the non-magnetic layer 5. This structure causes magnetostriction to occur in a crystal structure of the lower surface of the first pinned magnetic layer 4a, so that the magnetostriction coefficient λs of the pinned magnetic layer 4 increases. As a result, the uniaxial anisotropy of the pinned magnetic layer 4 increases, and thus it is possible to firmly fix the pinned magnetic layer 4 in a direction parallel to the height direction (the Y direction of FIG. 6) even when the antiferromagnetic layer 3 is not formed.

The free magnetic layer 6 includes an NiFeX alloy layer 6b and diffusion preventive layers 6a and 6c provided at both upper and lower sides of the NiFeX alloy layer 6b.

In FIGS. 5 and 6, particularly, the single-spin-valve thin film element has been described. However, the dual-spin-valve thin film element shown in FIG. 1 is formed of the same layer structure as those shown in FIGS. 5 and 6.

Figure 7:
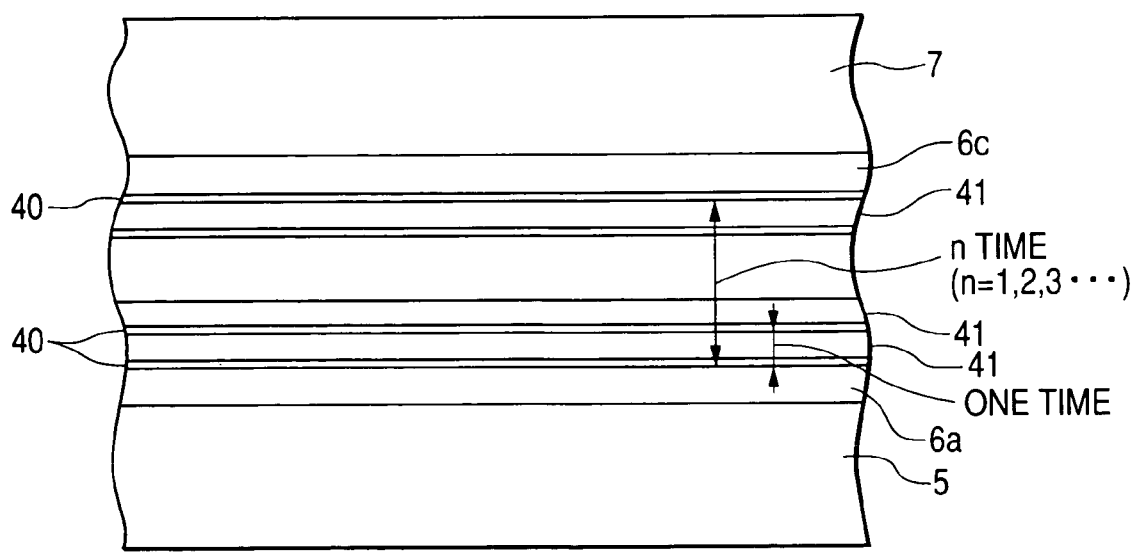
FIG. 7 is a process chart (a schematic diagram) illustrating a method of manufacturing the dual-spin-valve thin film element shown in FIG. 1.
Figure 8:
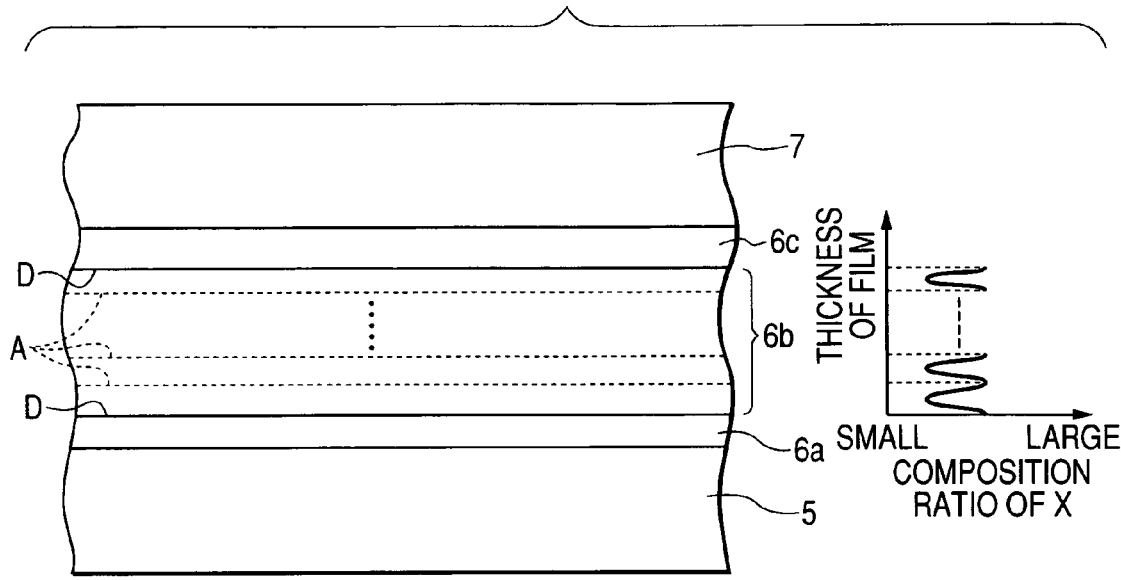
FIG. 8 is a process chart (a schematic diagram) illustrating a process performed in the next stage of that shown in FIG. 7.

FIGS. 7 and 8 are cross-sectional views illustrating a method of manufacturing the film structure of the dual-spin-valve thin film element shown in FIG. 1. More specifically, FIGS. 7 and 8 are partial enlarged views illustrating the film structure of the dual-spin-valve thin film element during the manufacturing process.

First, the underlying layer 1, the seed layer 2, the antiferromagnetic layer 3, the pinned magnetic layer 4, and the non-magnetic layer 5 are formed by, for example, a sputtering method or a vacuum deposition method. Since materials forming the layers have been described above with reference to FIG. 1, a description thereof will be omitted.

As shown in FIG. 7, the diffusion preventive layer 6a is formed on the non-magnetic layer 5 by, for example, the sputtering method or the vacuum deposition method. The diffusion preventive layer 6a is formed of, for example, a CoFe alloy. An X element layer 40 is formed with a small thickness on the diffusion preventive layer 6a, and the X element layer 40 is made of an element X (the element X is composed of at least element selected from Cu, Sc, Ti, Zn, Zr, Hf, Au, Ag, Mn, and Al). In addition, an NiFeX alloy layer 41 is formed on the X element layer 40 by, for example, the sputtering method or the vacuum deposition method. The thickness of the NiFeX alloy layer 41 is larger than that of the X element layer 40. A laminated structure of the element X layer 40 and the NiFeX alloy layer 41 is set as one unit (the number of laminations is one), and the laminating operation is performed n times (where n is a natural number). Then, after the X element layer 40 is formed on the NiFeX alloy layer 41 of the uppermost laminated structure, the diffusion preventive layer 6c is formed on the X element layer 40 by, for example, the sputtering method or the vacuum deposition method. The diffusion preventive layer 6c is formed of, for example, a CoFe alloy.

Subsequently, the non-magnetic layer 7 is formed on the diffusion preventive layer 6c by the sputtering method or the vacuum deposition method, and the pinned magnetic layer 8, the antiferromagnetic layer 9, and the protective layer 10 are formed by the sputtering method or the vacuum deposition method.

Successively, after a laminated structure from the underlying layer 1 to the protective layer 10 is formed, a thermal treatment is performed thereon. Then, an exchange coupling magnetic field is generated at interfaces between the antiferromagnetic layers 2 and 9 and the first pinned magnetic layers 4a and 8a of the pinned magnetic layers 4 and 8 to magnetize the first pinned magnetic layers 4a and 8a in a direction parallel to the height direction (the Y direction of the drawings). In addition, the RKKY interaction occurs between the first pinned magnetic layers 4a and 8a and the second pinned magnetic layers 4c and 8c, and the second pinned magnetic layers 4c and 8c are magnetized in a direction antiparallel to the magnetization direction of the first pinned magnetic layers 4a and 8a.

The thermal treatment causes the X element layer 41 and the NiFe alloy layer 40 to be diffused in the free magnetic layer 6. Regions A represented by broken lines in FIG. 8 indicate regions where the X element layer 41 is formed before the thermal treatment, but Ni and Fe as well as the element X exist in the regions A represented by the broken lines, by diffusion due to the thermal treatment. Therefore, as shown on the right side of FIG. 8, the element X has a higher composition ratio in the regions A than in the other regions. As shown on the right side of FIG. 8, increase and decrease in the composition ratio of the element X may repeatedly occur in the thickness direction (the Z direction of FIG. 8) in the free magnetic layer 6. As shown in FIG. 7, since the X element layers 40 are also provided between the diffusion preventive layers 6a and 6c and the NiFe alloy layer 41, the element X may have a high composition ratio in interface regions D with the diffusion preventive layers 6a and 6c as well as in the regions A represented by the broken lines (FIG. 8). In addition, some of the elements X may be diffused into the diffusion preventive layers 6a and 6c.

Further, it is preferable that the thickness of the X element layer 40 be in the range of 0 Å to 5 Å in order to effectively generate the diffusion. More preferably, the X element layer is formed with a thickness smaller than 2 Å. In addition, when the X element layer 40 is formed with a large thickness, magnetostriction can be reduced, but ΔRA is greatly decreased. Therefore, it is important to adjust the thickness ratio of the X element layer 40 to the NiFe alloy layer 41. In the invention, when a laminated structure of the X element layer 40 and the NiFe alloy layer 41 is set as one unit and when the thickness ratio of the X element layer in the one unit is defined as follows: [the thickness of the X element layer 40/(the thickness of the NiFe alloy layer 41+the thickness of the X element layer 40)×100(%), preferably, the thickness ratio of the X element layer is set in the range of 5% to 20%. In addition, when the NiFe alloy layer 40 has an excessively large thickness, the element X is not appropriately diffused in the entire region of the NiFe alloy layer 40, which causes the extension of a region composed of only NiFe. Therefore, it is preferable that the thickness of the NiFe alloy layer be in the range of 5 Å to 10 Å.

When the composition ratios of the X element layer 40 and the NiFe alloy layer 41 are adjusted in the above-mentioned ranges, it is possible to appropriately adjust the average composition ratio of the element X in the NiFeX alloy layer 6b in the range of 5 to 20 atomic percent.

Furthermore, it is preferable that, in the process shown in FIG. 7, the average composition ratio of Ni in the NiFe alloy layer 41 be in the range of 60 to 80 atomic percent. This makes it possible to increase the value of ΔRA and to reduce the coercive force of the NiFeX alloy layer 6b.

In the method of manufacturing the CPP-type dual-spin-valve thin film element shown in FIGS. 7 and 8, the X element layers 40 and the NiFe alloy layers 41 are alternatively formed so as to constitute at least a portion of the free magnetic layer 6. Therefore, this structure makes it possible to manufacture a CPP-type spin-valve thin film element capable of increasing the value of ΔRA and of reducing the magnetostriction of the free magnetic layer 6 with a simple manufacturing method, without changing the existing manufacturing facilities.

Further, in the invention, at least a portion of the free magnetic layer 6 may be formed of the NiFeX alloy layer 6b, by using a target made of, for example, Ni, Fe, and X. In this case, it is considered that the element X is uniformly diffused into the NiFeX alloy layer 6b.

The free magnetic layer 6 may include only the NiFeX alloy layer 6b.

EXAMPLES

The dual-spin-value thin film element shown in FIG. 1 is manufactured.

The basic film structure thereof is as follows: the underlying layer 1; Ta (30)/the seed layer 2; NiFeCr (50)/the lower antiferromagnetic layer 3; IrMn (70)/the lower pinned magnetic layer 4 [the first magnetic layer 4a; FeCo (30)/the non-magnetic intermediate layer 4b; Ru (9.1)/the non-magnetic-intermediate-layer-side magnetic layer 4c2; FeCo (10)/the non-magnetic-layer-side magnetic layer 4c1; CoMnGe (40)]/the non-magnetic layer 5; Cu (43)/the free magnetic layer 6/the non-magnetic layer 7; Cu (43)/the upper pinned magnetic layer 8 [the non-magnetic-layer-side magnetic layer 8c1; CoMnGe (40)/the non-magnetic-intermediate-layer-side magnetic layer 8c2; FeCo (10)/the non-magnetic intermediate layer 8b; Ru (9.1)/the first pinned magnetic layer 8a; FeCo (30)]/the upper antiferromagnetic layer 9; IrMn (70)/the protective layer 10; Ta (200). Here, the parenthesized numerical values indicate thicknesses, and the unit thereof is angstrom.

In the experiment, the laminated structure of the free magnetic layer 6 (before a thermal treatment) is changed in various manners. As a result, the following three samples are prepared. The laminated structure of the free magnetic layer 6 in each sample is as follows:

(Sample 1; Comparative Example)
CoFe (5)/[NiFe (8)]×8/CoFe (5);
(Sample 2; Example 1)
CoFe (5)/[Cu (1)/NiFe (8)]×8/Cu (1)/CoFe (5); and
(Sample 3; Example 2)
CoFe (5)/[Cu (2)/NiFe (8)]×8/Cu (2)/CoFe (5).

In the notation of the laminated structures of the free magnetic layers, the parenthesized numerical values indicate thicknesses (Å). In addition, the symbol '×8' means that the film structure in the brackets is laminated eight times. In all the samples, the composition ratio of Ni in the NiFe alloy is 75 atomic percent.

After each sample is formed, a thermal treatment is performed thereon.

Then, an examination is made of the relationship between the thickness of each Cu film formed in the free magnetic layer 6 when the basic structure of each sample is laminated (before the thermal treatment) and the value of ΔRA measured after the thermal treatment. The results of the experiments are shown in FIG. 9.

Figure 9:
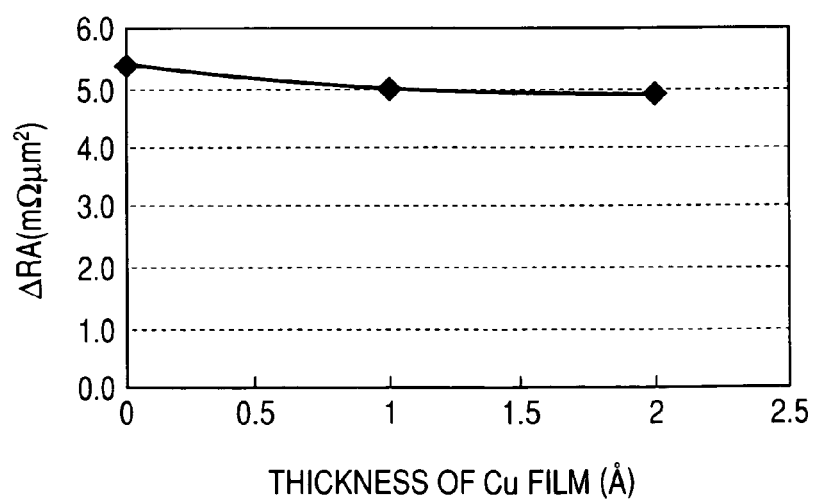
FIG. 9 is a graph illustrating the relationship among the thicknesses of Cu films formed in free magnetic layers of magnetic detecting elements of samples 1 to 3 and the values of ΔRA of the samples measured after a thermal treatment is performed on the samples.

As shown in FIG. 9, when the thickness of the Cu film increases, the value of ΔRA is showing a tendency to decrease, but decreases sharply. Therefore, the Cu film having a small thickness makes it possible to maintain large ΔRA.

Then, an examination is made of the relationship between the thickness of each Cu film formed in the free magnetic layer 6 when the basic structure of each sample is laminated (before the thermal treatment) and the magnetostriction coefficient λs measured after the thermal treatment. The results of the experiments are shown in FIG. 10.

Figure 10:
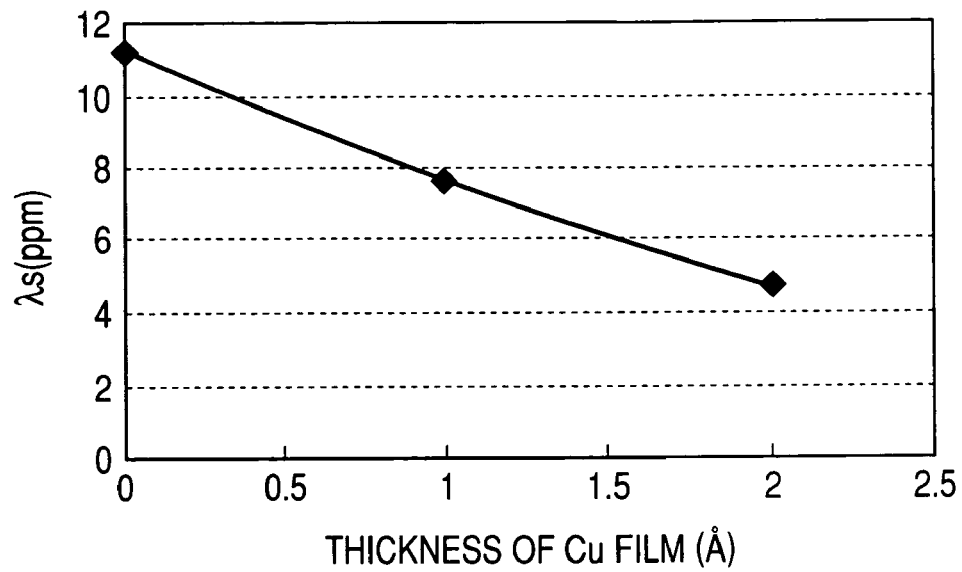
FIG. 10 is a graph illustrating the relationship among the thicknesses of the Cu films formed in the free magnetic layers of the magnetic detecting elements of the samples 1 to 3 and the magnetostriction of the samples measured after the thermal treatment is performed on the samples.

As shown in FIG. 10, when the thickness of the Cu film increases, the magnetostriction is reduced. In particular, when the thickness of the Cu film increases, the reduction ratio of magnetostriction is higher than the reduction ratio of ΔRA, compared with the structure in which the Cu film is not laminated on the free magnetic layer 6 (comparative example). For example, when the Cu film has a thickness of 2 Å, the reduction ratio of ΔRA {[(ΔRA when the Cu film is not laminated−ΔRA when the Cu film is laminated with a thickness of 2 Å)/ΔRA when the Cu film is not laminated]×100 (%)} is about 9.5%, compared with the structure in which the Cu film is not laminated on the free magnetic layer 6 (comparative example). On the other hand, the reduction ratio of magnetostriction {[(magnetostriction when the Cu film is not laminated−magnetostriction when the Cu film is laminated with a thickness of 2 Å)/magnetostriction when the Cu film is not laminated]×100(%)} is about 57%, compared with the structure in which the Cu film is not laminated on the free magnetic layer 6 (comparative example). Therefore, the Cu film laminated on the free magnetic layer 6 makes it possible to prevent a reduction in ΔRA and to reduce the magnetostriction.

Then, the laminated structure of the free magnetic layer 6 (before the thermal treatment) is formed as follows, and a plurality of samples having different composition ratios of Ni in the NiFe alloy are prepared. The laminated structure of the free magnetic layer 6 in each sample is as follows: CoFe (5)/[Cu (1)/NiFe (8)]×8/Cu (1)/CoFe (5). In the notation of the laminated structure of the free magnetic layer, the parenthesized numerical values indicate thicknesses (Å). In addition, the symbol '×8' means that the film structure in the brackets is laminated eight times.

In a sample 4, the composition ratio of Ni in the NiFe alloy is 25 atomic percent. In a sample 5, the composition ratio of Ni in the NiFe alloy is 40 atomic percent. In a sample 6, the composition ratio of Ni in the NiFe alloy is 50 atomic percent. In a sample 7, the composition ratio of Ni in the NiFe alloy is 60 atomic percent. In a sample 8, the composition ratio of Ni in the NiFe alloy is 75 atomic percent. In a sample 9, the composition ratio of Ni in the NiFe alloy is 80 atomic percent. In a sample 10, the composition ratio of Ni in the NiFe alloy is 90 atomic percent. In a sample 11, the composition ratio of Ni in the NiFe alloy is 100 atomic percent, that is, the sample 11 is formed of only Ni.

After each sample is formed, a thermal treatment is performed thereon.

Figure 11:
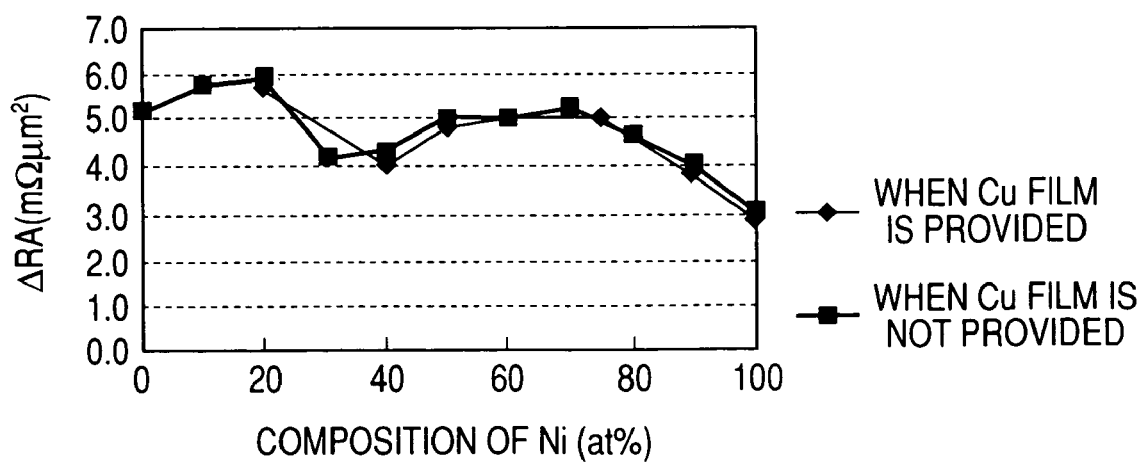
FIG. 11 is a graph illustrating the relationship among the composition ratios of Ni contained in NiFe alloy layers which are formed in free magnetic layers of magnetic detecting elements of samples 4 to 11 and the values of ΔRA of the samples measured after a thermal treatment is performed on the samples.

Then, an examination is made of the relationship between the composition ratio of Ni in the NiFe alloy when the basic structure of each sample is laminated (before the thermal treatment) and the value of ΔRA measured after the thermal treatment. The results of the experiments are shown in FIG. 11. FIG. 11 also shows the value of ΔRA (comparative example) when the free magnetic layer 6 is not formed of a laminated structure of the Cu layer and the NiFe alloy layer, that is, when the free magnetic layer 6 is formed of a laminated structure including CoFe (5)/NiFe (8)×8/CoFe (5) and the composition ratio of Ni in the NiFe alloy is changed as in the above-mentioned structure samples.

As shown in FIG. 11, when the free magnetic layer 6 is formed of a Cu film and when the free magnetic layer 6 is not formed of the Cu film, the value of ΔRA is not greatly changed. However, from the results of the experiments shown in FIG. 9, when the free magnetic layer 6 is formed of the Cu laminate, it is considered that the value of ΔRA slightly decreases, compared with the structure in which the free magnetic layer 6 is not formed of the Cu film.

As shown in FIG. 11, in both cases in which the free magnetic layer 6 is formed of the Cu film and it is not formed of the Cu film, it is preferable that the composition ratio of Ni be in the range of 10 to 25 atomic percent or in the range of 60 to 80 atomic percent in order to increase the value of ΔRA. Therefore, in the invention, a portion of the free magnetic layer 6 is formed of a laminated structure of a Cu film and an NiFe film. In addition, when the composition ratio of Ni in an NiFeCu alloy which is formed by diffusing Cu and NiFe by using a thermal treatment is defined as follows: [the average composition ratio of Ni/(the average composition ratio of Ni+the average composition ratio of Fe)]×100(%), the composition ratio of Ni is preferably set in the range of 10% to 25% or in the range of 60% to 80%.

Then, for the experiments, a plurality of samples having different laminated structures of the free magnetic layer 6 (before the thermal treatment) are prepared. The laminated structure of the free magnetic layer 6 in each sample is as follows:
(Sample 12; Comparative Example)
CoFe (5)/(NiFe (8)]×8/CoFe (5);
(Sample 13; Example)
CoFe (5)/[Cu (1)/NiFe (8)]×8/Cu (1)/CoFe (5);
(Sample 14; Example)
CoFe (5)/[Cu (2)/NiFe (8)]×8/Cu (2)/CoFe (5);
(Sample 15; Example)
CoFe (5)/[Cu (0.5)/NiFe (4)]×16/Cu (0.5)/CoFe (5);
(Sample 16; Example)
CoFe (5)/[Cu (1)/NiFe (4)]×16/Cu (1)/CoFe (5); and
(Sample 17; Example)
CoFe (5)/[Cu (1)/NiFe (8)]×12/Cu (1)/CoFe (5).

In the notation of the laminated structures of the free magnetic layer, the parenthesized numerical values indicate thicknesses (Å). In addition, the symbols '×8', '×16', and '×12' mean that the film structure in the bracket is laminated eight times, sixteen times, and twelve times, respectively.

Further, three laminated structures are prepared for each of the samples 12 to 17: one laminated structure in which the composition ratio of Ni in NiFe is 70 atomic percent; another laminated structure in which the composition ratio of Ni in NiFe is 75 atomic percent; and the other laminated structure in which the composition ratio of Ni in NiFe is 80 atomic percent. Then, a thermal treatment is performed on each sample, and the value of ΔRA of each sample is measured. The results of the experiments are shown in FIG. 12.

Figure 12:
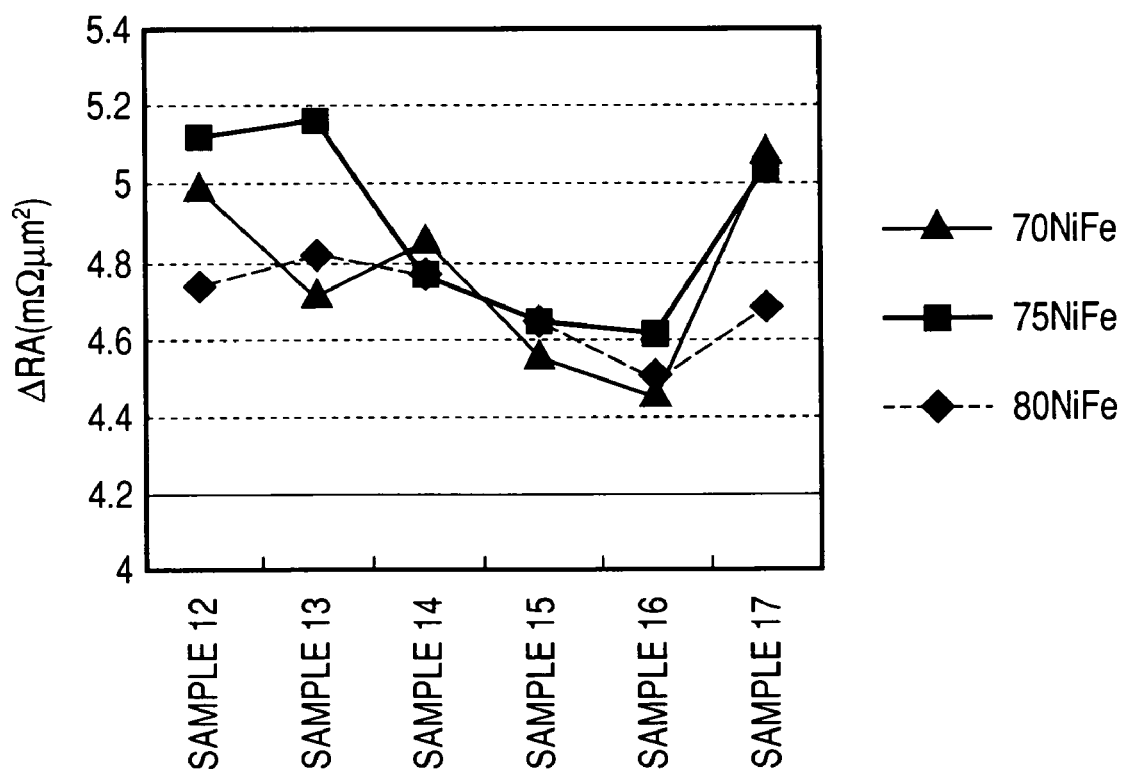
FIG. 12 is a graph illustrating the values of ΔRA of magnetic detecting elements of samples 12 to 17 which respectively have a free magnetic layer in which the composition ratio of Ni in an NiFe alloy layer is 70 atomic percent, a free magnetic layer in which the composition ratio of Ni in an NiFe alloy layer is 75 atomic percent, and a free magnetic layer in which the composition ratio of Ni in an NiFe alloy layer is 80 atomic percent.

As shown in FIG. 12, for example, when the value of ΔRA of the sample 13 is compared with that of the sample 16, the value of ΔRA of the sample 13 is larger than that of the sample 16. This is because the Cu films in the sample 13 and the sample 16 have the same thickness of 1 Å, but the thickness of the NiFe alloy film of the sample 13 is larger than that of the sample 16. Therefore, when the ratio of the thickness of the Cu film to the thickness of the NiFe alloy film is excessively large, the value of ΔRA greatly decreases. In addition, the range of the thickness (absolute value) of the NiFe alloy film and the range of the thickness (absolute value) of the Cu film as well as the thickness ratio of the Cu film are defined in order to increase the value of ΔRA and to promote a reduction in magnetostriction by appropriately diffusing Cu and NiFe.

In the invention, after the results of the experiments shown in FIGS. 9 to 12 are collectively considered, the thickness of the Cu film is set in the range of 0 Å to 5 Å, and more preferably, is set to be smaller than 2 Å, and the thickness of the NiFe alloy film is set in the range of 5 Å to 10 Å. In addition, when a laminated structure of the Cu film and the NiFe alloy film is set as one unit and when the thickness ratio of the Cu film in the one unit is defined as follows: [the thickness of the Cu film/(the thickness of the Cu film+the thickness of the NiFe alloy film)]×100(%), preferably, the thickness ratio of the Cu film is set in the range of 5% to 20%. Therefore, when the thickness ratio of the Cu film is set in the above-described range, it is possible to set the average composition ratio of the element X contained in the NiFeX alloy which is formed by diffusion due to a thermal treatment in the range of 5 to 20 atomic percent.

The invention claimed is:

1. A magnetic detecting element comprising:
a pinned magnetic layer whose magnetization direction is fixed; and
a free magnetic layer which is formed on the pinned magnetic layer with a non-magnetic layer interposed therebetween and whose magnetization direction varies in accordance with an external magnetic field,
wherein the free magnetic layer is formed of NiFeX alloy layer only or NiFeX alloy layer and a diffusion preventive layer formed of CoFe (an element X is composed of at least one element selected from Cu, Sc, Ti, Zn, Zr, Hf, Au, Ag, Mn, and Al),
an average composition ratio of the element X is in the range of 5 to 20 atomic percent, and
regions where the composition ratio of the element X increases from the lower surface toward the upper surface of the NiFeX alloy layer, and regions where the composition ratio of the element X decreases from the lower surface toward the upper surface of the NiFeX alloy layer are alternately formed.

2. The magnetic detecting element according to claim 1, wherein {[the average composition ratio of Ni/(the average composition ratio of Ni+the average composition ratio of Fe)]×100} is in the range of 60 to 80.

3. The magnetic detecting element according to claim 1, wherein the element X is Cu.

4. The magnetic detecting element according to claim 1, wherein the free magnetic layer has a laminated structure in which diffusion preventive layers are formed on lower and upper sides of the NiFeX alloy layers, and
one of the diffusion preventive layer comes into contact with an interface with the non-magnetic layer.

5. The magnetic detecting element according to claim 1, wherein a plurality of the non-magnetic layers are formed on the lower and upper sides of the free magnetic layer, and
a plurality of the pinned magnetic layers are positioned on the upper side of a first of the non-magnetic layers and on the lower side of a second of the non-magnetic layers.

6. The magnetic detecting element according to claim 5, wherein antiferromagnetic layers are positioned on the upper side of a first of the pinned magnetic layers and on the lower side of a second of the pinned magnetic layers to fix the magnetization directions of the pinned magnetic layers in predetermined directions by an exchange anisotropic magnetic field.

7. The magnetic detecting element according to claim 1, wherein a sensing current flows in a direction perpendicular to surfaces of the pinned magnetic layer, the non-magnetic layer, and the free magnetic layer.

8. A magnetic detecting element comprising:
an antiferromagnetic layer;
a pinned magnetic layer which is formed so as to come into contact with the antiferromagnetic layer and whose magnetization direction is fixed in accordance with an exchange anisotropic magnetic field with the antiferromagnetic layer; and
a free magnetic layer which is formed on the pinned magnetic layer with a non-magnetic layer interposed therebetween,
wherein the free magnetic layer is formed of NiFeX alloy layer only or NiFeX alloy layer and a diffusion preventive layer formed of CoFe (an element X is composed of at least one element selected from Cu, Sc, Ti, Zn, Zr, Hf, Au, Ag, Mn, and Al),
an average composition ratio of the element X is in the range of 5 to 20 atomic percent, and
regions where the composition ratio of the element X increases from the lower surface toward the upper surface of the NiFeX alloy layer, and regions where the composition ratio of the element X decreases from the lower surface toward the upper surface of the NiFeX alloy layer are alternately formed.

9. A method of manufacturing a magnetic detecting element,
the magnetic detecting element including:
a pinned magnetic layer whose magnetization direction is fixed; and
a free magnetic layer which is formed on the pinned magnetic layer with a non-magnetic layer interposed therebetween and whose magnetization direction varies in accordance with an external magnetic field,
the method comprising:
forming the free magnetic layer having at least an NiFeX alloy layer therein (an element X is composed of at least one element selected from Cu, Sc, Ti, Zn, Zr, Hf, Au, Ag, Mn, and Al) wherein the NiFeX alloy layer is formed by alternately laminating NiFe alloy layers and X element layers made of the X element, and
setting an average composition ratio of the element X in the range of 5 to 20 atomic percent.

10. The method of manufacturing a magnetic detecting element according to claim 9,
wherein, when a laminated structure including the X element layer and the NiFe alloy layer is set as one unit, and when a thickness ratio of the X element layer in the one unit is defined as follows:

[the thickness of the X element layer/(the thickness of the NiFe alloy layer+the thickness of the X element layer)×100], the thickness ratio of the X element layer is set in the range of 5 to 20.

11. The method of manufacturing a magnetic detecting element according to claim 9,
wherein the thickness of each X element layer is set in the range of 0 Å to 5 Å.

12. The method of manufacturing a magnetic detecting element according to claim 9,
wherein the thickness of each NiFe alloy layer is set in the range of 5 Å to 10 Å.

13. The method of manufacturing a magnetic detecting element according to claim 9,
wherein the average composition ratio of Ni in each NiFe alloy layer is set in the range of 60 to 80 atomic percent.

14. The method of manufacturing a magnetic detecting element according to claim 9, further comprising:
performing, after forming the magnetic detecting element, a thermal treatment on the magnetic detecting element.

* * * * *